United States Patent [19]
Zhao et al.

[11] Patent Number: 5,789,028
[45] Date of Patent: Aug. 4, 1998

[54] METHOD FOR ELIMINATING PEELING AT END OF SEMICONDUCTOR SUBSTRATE IN METAL ORGANIC CHEMICAL VAPOR DEPOSITION OF TITANIUM NITRIDE

[75] Inventors: Joe W. Zhao, San Jose; Wei-Jen Hsia, Sunnyvale; Wilbur G. Catabay, Santa Clara, all of Calif.

[73] Assignee: LSI Logic Corporation, Milpitas, Calif.

[21] Appl. No.: 811,818

[22] Filed: Mar. 4, 1997

[51] Int. Cl.$^6$ .................................................. C23C 16/34
[52] U.S. Cl. ........................... 427/255.2; 427/248.1; 427/255.1
[58] Field of Search ........................... 427/248.1, 255.1, 427/255.2

[56] References Cited

U.S. PATENT DOCUMENTS 5,230,741  7/1993  Van De Ven et al. ............... 118/728
5,578,532  11/1996  Van De Ven et al. ............... 427/248.1

OTHER PUBLICATIONS

Raaijmakers, Thin Solid Films, 247 pp. 85–93 (no month), 1994.

Primary Examiner—Michael Lusignan
Assistant Examiner—Timothy Meeks
Attorney, Agent, or Firm—John P. Taylor

[57] ABSTRACT

A process and apparatus are described for inhibiting, but not completely eliminating, the deposition of titanium nitride by MOCVD on the end edge of a semiconductor substrate which comprises directing toward such substrate end edge a flow of one or more deposition-inhibiting gases in a direction which substantially opposes the flow of process gases toward the end edges of the substrate. This flow of deposition-inhibiting gases toward the end edges of the substrate reduces the deposition of the titanium nitride at the end edge of the semiconductor substrate either by directing some of the flow of process gases away from such end edge of the substrate, or by locally diluting such process gases in the region of the deposition chamber adjacent the end edge of the substrate, or by some combination of the foregoing.

Such flow of deposition-inhibiting gas or gases may be directed toward the end edge of the substrate by flowing such deposition-inhibiting gas or gases through bores provided in the underlying substrate support pedestal which bores have openings peripherally spaced around the pedestal, adjacent the top of the pedestal, through which such gas or gases then exit beneath the plane of the top surface of the substrate and adjacent the end edge of the substrate.

9 Claims, 5 Drawing Sheets

METHOD FOR ELIMINATING PEELING AT END OF SEMICONDUCTOR SUBSTRATE IN METAL ORGANIC CHEMICAL VAPOR DEPOSITION OF TITANIUM NITRIDE

BACKGROUND OF THE INVENTION

1. Field of the Invention

This invention related to integrated circuit structures formed on semiconductor substrates. More particularly this invention relates to a method and apparatus for eliminating the peeling of titanium nitride formed at the end edge of a semiconductor substrate by metal organic chemical vapor deposition.

2. Description of the Related Art

Integrated circuit structures utilize patterned metal layers formed over insulating layers to thereby provide metal interconnects or wiring between active devices comprising portions of the integrated circuit structure. Particularly when metals such as tungsten, aluminum, or aluminum/copper alloys are used in the formation of such metal interconnects, it is preferred to form a barrier layer of TiN over the insulating layer prior to the formation of the metal layer to promote adhesion of the subsequently deposited metal layer to the structure, as well as to prevent interaction between such metals and underlying materials, e.g., exposed silicon surfaces or exposed surfaces of other metals lying beneath a via or contact opening in the underlying insulating layer.

To enhance the step coverage of the TiN, as well as to conserve the thermal budget (limit exposure of the integrated circuit structure to elevated processing temperatures to inhibit excessive diffusion of dopants), CVD formation of such a TiN barrier layer is preferably carried out at a low deposition temperature, e.g., below about 325° C., preferably using an organic source of titanium as the gaseous source of titanium. Such a deposition is referred to as a metal organic chemical vapor deposition or MOCVD.

The formation of a titanium nitride barrier layer on a semiconductor substrate using MOCVD can, however, result in the formation of a titanium nitride barrier layer of non-homogeneous thickness. In particular, the thickness of the deposited titanium nitride layer at the end edge of the substrate sometimes exceeds the thickness of the barrier layer formed on other portions of the top surface of the substrate. For example, when a titanium nitride barrier layer is deposited having a uniform thickness of about 300Å Angstroms (Å) across the top surface of the substrate, the end edge of the substrate may have as much as 400 Å of titanium nitride deposited thereon.

This is illustrated in FIGS. 1 and 1A wherein a semiconductor substrate 2 is shown mounted in a CVD chamber 20 on a wafer support 22 while MOCVD deposition gases flow down from a showerhead 24 in chamber 20 over top surface 4 of substrate 2 and around end edges 6 of substrate 2. As shown in FIG. 1A (which is purposely shown disproportionately enlarged for illustrative purposes only), titanium nitride barrier layer 14 being deposited over top surface 4 of substrate 2 is of a generally uniform thickness, while titanium nitride 16 being deposited on end edge 6 of substrate 2 is non-uniform in thickness and thicker than layer 14.

This additional thickness of titanium nitride deposited on the end edge of the substrate may be the result of film stress, film properties, and/or due to the MOCVD system design. Regardless of the cause, however, this resulting additional thickness of titanium nitride portion 16 at the end edge 6 of substrate 2, which reduces the ability of the titanium nitride coating to bend or flex, results in an increased tendency for titanium nitride coating 16 to crack and peel (i.e., non-adherence of the titanium nitride coating) as substrate 2 is heated and cooled during subsequent processing. Such cracking and peeling or non-adherence of those thicker portions 16 of the deposited titanium nitride barrier layer can, in turn, result in particle generation which is highly undesirable in the formation and processing of integrated circuit structures on the semiconductor substrate.

While it has been proposed to solve this problem by masking the surface of the end edge of the substrate, such is unacceptable because such a mask, in addition to creating additional processing steps, would need to be removed prior to the subsequent deposition of a metal layer over the titanium nitride barrier layer, and such removal would expose bare surfaces of the previously masked semiconductor substrate to the metal being deposited, i.e., result in substrate surfaces not provided with the desired barrier layer of titanium nitride under the metal layer.

Furthermore, if a peripheral shield of some kind was used to inhibit deposition of the titanium nitride on the end edge of the substrate without, however, completely preventing deposition of the desired titanium nitride barrier layer on the end edge of the substrate, this would result in additional hardware in the deposition chamber which would need to be periodically cleaned.

It would, therefore, to be highly desirable to provide a process and apparatus whereby a titanium nitride barrier layer, formed by MOCVD, could be deposited over a semiconductor surface, including the end edge of the substrate, without, however, increasing the thickness of those portions of the titanium nitride barrier layer deposited on the end edge of the substrate, relative to the thickness of the remainder of the deposited titanium nitride barrier layer.

SUMMARY OF THE INVENTION

In accordance with the invention, deposition of titanium nitride by MOCVD on the end edge of a semiconductor substrate is reduced, without eliminating such deposition, by directing toward the substrate end edge a flow of one or more deposition-inhibiting gases in a direction which opposes the flow of process gases toward the end edges of the substrate. This flow of deposition-inhibiting gases toward the end edge of the substrate reduces the deposition of the titanium nitride at the end edge of the semiconductor substrate either by directing some of the flow of deposition gas or gases away from the end edge of the substrate, or by locally diluting such deposition gas or gases in the region of the deposition chamber adjacent the end edge of the substrate, or by some combination of the foregoing.

Such flow of deposition-inhibiting gas or gases may be directed toward the end edge of the substrate by flowing such deposition-inhibiting gas or gases through bores provided in the underlying substrate support pedestal which bores have openings peripherally spaced around the pedestal, adjacent the top of the pedestal, through which such gas or gases then exit beneath the plane of the top surface of the substrate and adjacent the end edge of the substrate.

DETAILED DESCRIPTION OF THE INVENTION

Figure 1:
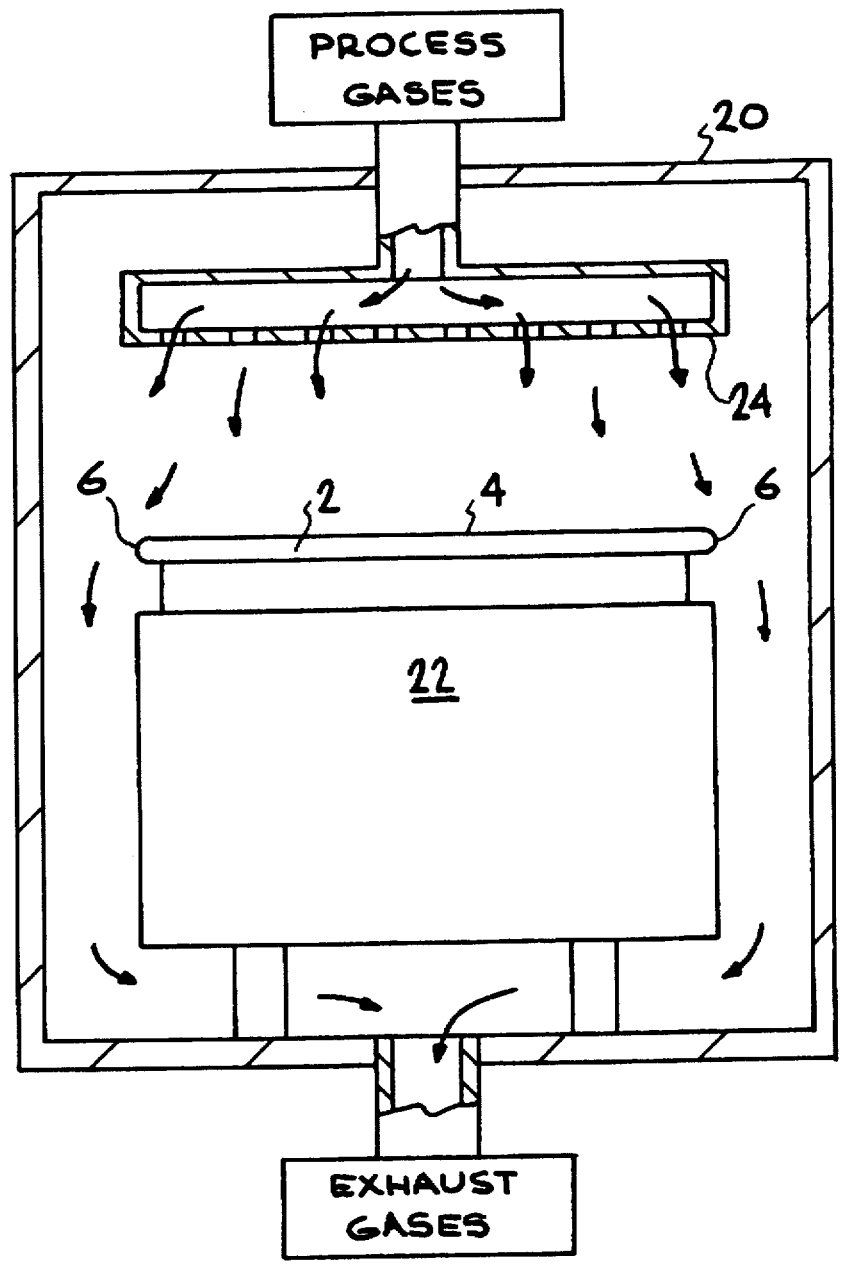
FIG. 1 is a fragmentary vertical side section view of a prior art deposition chamber showing a semiconductor substrate mounted in the chamber on a substrate support pedestal with a layer of titanium nitride being deposited on the substrate with thicker regions being deposited at the end edge of the substrate.
Figure 1A:
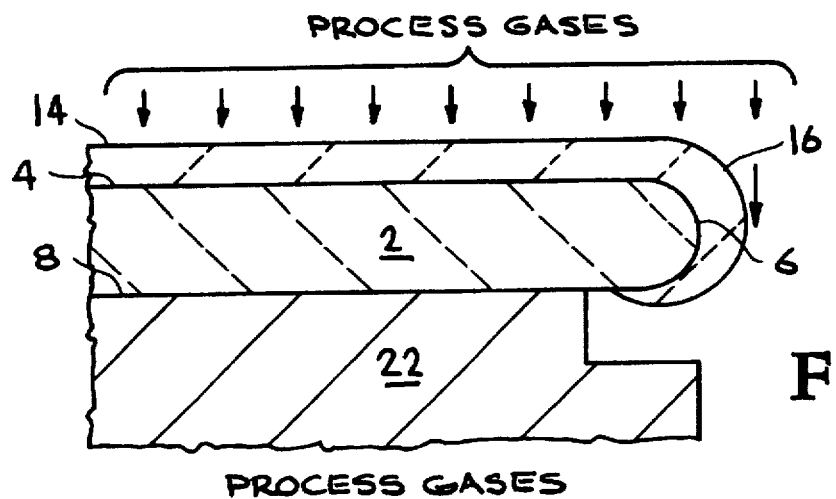
FIG. 1A is a fragmentary vertical side-section view of an enlarged portion of the structure shown in FIG. 1 to illustrate the thicker amount of titanium nitride barrier layer being deposited over the end edge of the semiconductor substrate.
Figure 2A:
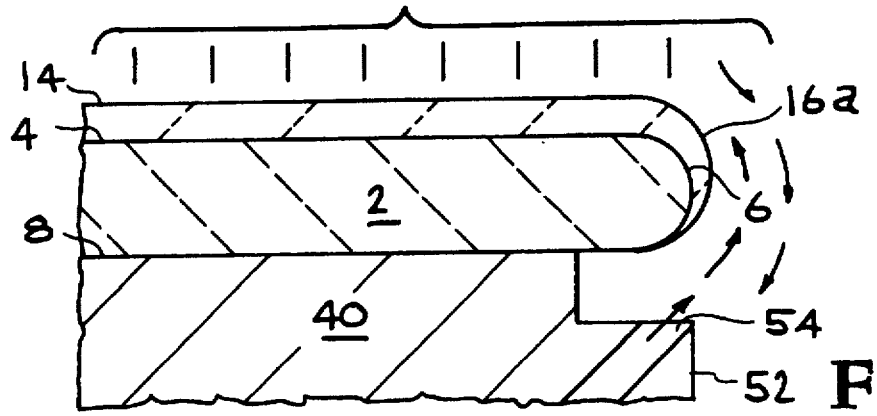
FIG. 2A is a fragmentary vertical side-section view of an enlarged portion of the structure shown in FIG. 2 to illustrate the thinner amount of titanium nitride barrier layer being deposited over the end edge of the semiconductor substrate, in accordance with the invention.
Figure 2:
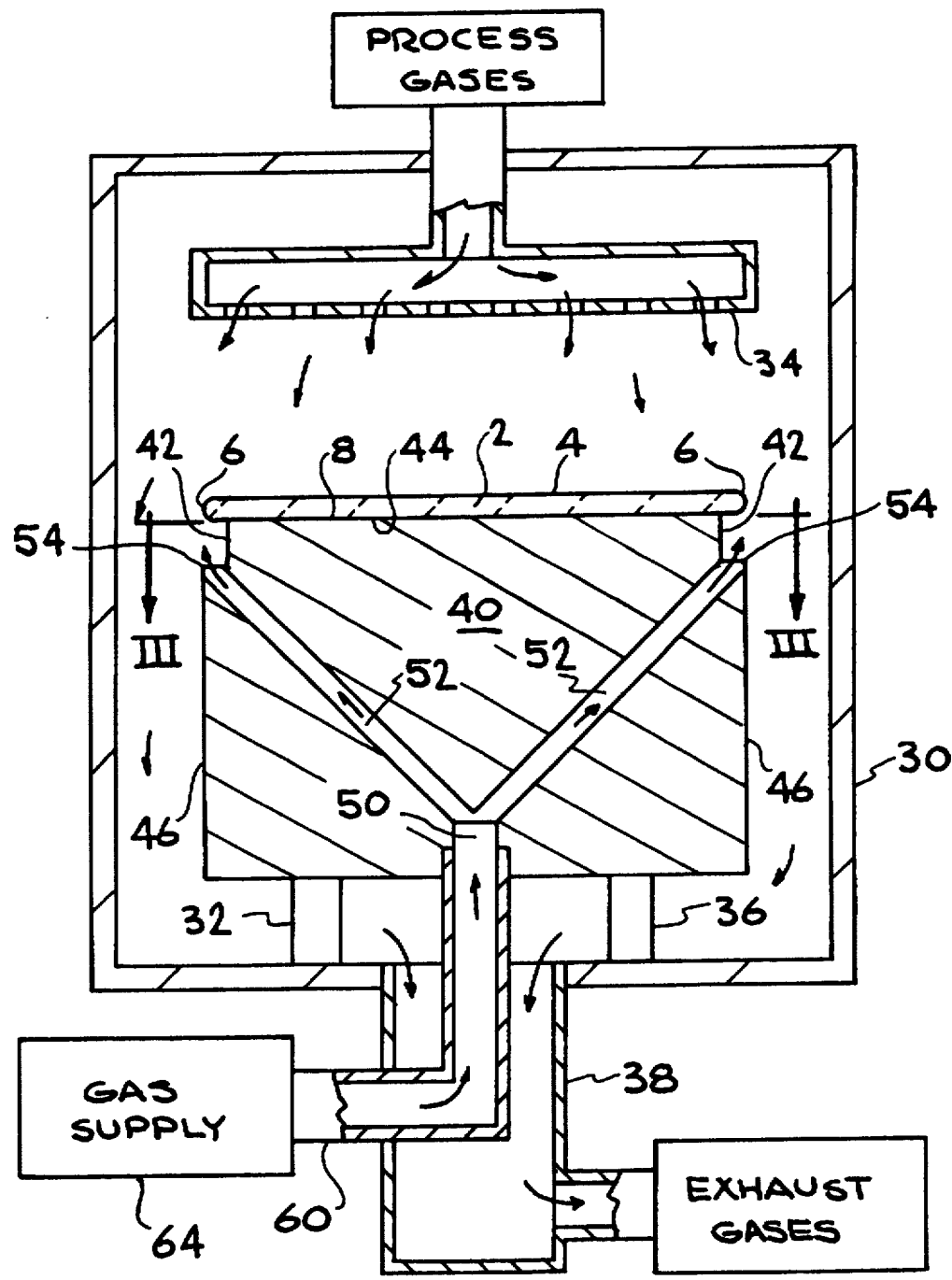
FIG. 2 is a fragmentary vertical side section view of a deposition chamber showing a semiconductor substrate mounted in the chamber on a substrate support pedestal constructed in accordance with the invention, to provide a flow of deposition-inhibiting gas adjacent the end edge of the substrate so that a layer of titanium nitride will be deposited on the substrate with thinner regions deposited adjacent the end edge of the substrate.

Referring now to FIG. 2, a deposition chamber 30 is shown having a conventional showerhead 34 depending from the top of the deposition chamber to provide a means for entry of process deposition gases into chamber 30, as is well known to those skilled in the art. Mounted within chamber 30 below showerhead 34 is a semiconductor support pedestal 40 which is constructed in accordance with the invention, as will be further described below. Resting on upper surface 44 of pedestal 40 is a semiconductor substrate 2 which, in the illustrate embodiment, is cylindrical. Substrate 2 has a top surface 4 and an end edge 6, as previously described with respect to the prior art apparatus of FIGS. 1 and 1A. One or more pedestal mounts 32 and 36 may be provided to mount pedestal 40 on the bottom wall of deposition chamber 30. A central exhaust port 38 may be centrally positioned in the bottom wall of chamber 30 below pedestal 30 to provide an exit for the process gases being admitted to deposition chamber 30 through showerhead 34. Exhaust port 38 may, in turn, be connected to a conventional gas exhaust or vacuum pumping system (not shown), as is well known to those skilled in the art.

Substrate support pedestal 40, which, in the illustrated embodiment, is also cylindrical, has an upper pedestal portion 42 of reduced diameter directly below substrate 2, having a diameter slightly smaller, in this embodiment, to that of substrate 2. The upper surface 44 of upper portion 42 of pedestal 40 engages lower surface 8 of substrate 2 to thereby support substrate 2 in chamber 30. Pedestal 40 is further provided with a lower cylindrical portion 46 of larger diameter which terminates at reduced diameter upper portion 42.

A series of angled bores 52 are provided within lower pedestal portion 46 terminating, at their lower ends, in a common bore 50 which is, in turn, connected to a tube 60 which extends through the bottom wall of chamber 30 to an external gas supply 64 for the deposition-inhibiting gas or gases. The upper end 54 of each bore 52 terminates, in the illustrated embodiment, adjacent the intersection of upper pedestal portion 42 and lower pedestal portion 46.

In accordance with the invention, one or more deposition-inhibiting gases are then flowed into chamber 30 from gas supply 64 through tube 60, common bore 50, angled bores 52, and bore ends 54, emerging from bore ends 54 adjacent end edge 6 of substrate 2.

At the same time, the MOCVD deposition or processing gases, comprising a gaseous source of nitrogen and a gaseous organic source of titanium, are flowed into chamber 30 down toward top surface 4 of substrate 2 through downwardly facing openings (not shown) in showerhead 34. When the upwardly flowing deposition-inhibiting gases emerging from bore ends 54 encounter the process gases flowing downwardly toward and around end edge 6 of substrate 2, the process gases are either deflected from end edge 6 of substrate 2 or are diluted sufficiently that, in either case, the amount of titanium nitride deposited on end edge 6 of substrate 2 will result in a thickness of deposited titanium nitride on end edge 6 which is less than the thickness of titanium nitride layer 14 deposited on top surface 4 of substrate 2.

This is shown in FIG. 2A wherein titanium nitride layer 14 formed on top surface 4 of substrate 2 is of the same thickness as titanium layer 14 formed on the top surface 4 of substrate 2 in prior art FIG. 1A, but titanium nitride layer 16a shown in FIG. 2A as formed over end edge 6 of substrate 2, in accordance with the invention, is not only thinner than titanium nitride layer 16 shown in prior art FIG. 1A, but it is also thinner than titanium nitride layer 14 formed on the top surface of substrate 2.

It should be noted that the use of the term "end edge" 6 in connection with the deposition of titanium nitride on substrate 2, is intended to define that portion of the titanium nitride deposition which forms on the generally curved end portion of substrate 2 as seen in FIG. 2A. More particularly it refers to that portion of the titanium nitride deposition on that portion of the curved end portion which commences at an angle of about 20° to the plane defined by flat top surface 4 of substrate 2 and extends at least to a point on the curved end surface which defines an angle of 90° to the plane of top surface 4 of substrate 2. Thus, the flow rate of the deposition-inhibiting gas must be sufficient to influence (and reduce) the thickness of the titanium nitride layer being formed on the end edge of the substrate commencing at a point of about 20° and extending to a point which is at least 90° from the plane of the upper surface of the substrate.

The deposition-inhibiting gas or gases emerging from bore ends 54 may comprise either non-reactive gases, including nitrogen and Group VIII noble gases such as helium, neon, argon, krypton, and xenon; or reactive gases such as ammonia, which will react with the organic source of titanium process gas flowing through showerhead 34.

The gaseous nitrogen source of process gas used in the formation of the TiN barrier layer, and which flows into chamber 30 through showerhead 34, may comprise any gaseous nitrogen source capable of proving a source of nitrogen, and also reacting with organic residues from decomposition of the gaseous titanium source, when the gaseous titanium source is an organic material. While the nitrogen source of process gas could be organic, preferably an inorganic source of nitrogen such as ammonia is used as the gaseous source of nitrogen because of the liberation of hydrogen therefrom which will react with the organic portion of the gaseous organic source of titanium to form a gas or gases which may be removed by evacuation from the CVD chamber during the deposition. It should be noted, however, that the gaseous source of nitrogen should not include any materials which may liberate oxygen or in any way form oxide products or byproducts which could co-deposit with the TiN barrier layer and thereby increase the resistivity of the barrier layer.

The gaseous organic source of titanium process gas which is flowed into chamber 30 through showerhead 34 may comprise, by way of example, and not of limitation, TDEAT (tetrakis(diethylamido) titanium) having the formula Ti[N(CH$_3$CH$_2$)$_2$]$_4$, or TDMAT (tetrakis(dimethylamido) titanium) having the formula Ti[N(CH$_3$)$_2$]$_4$.

The process gases are flowed into the CVD chamber through showerhead 34 in a ratio of the gaseous titanium source to the gaseous reactive nitrogen source which will be at least about 1 part by volume of the gaseous titanium source per 20 parts by volume of the gaseous nitrogen source (1:20) up to about 1 part by volume of the gaseous titanium source per 1 part per volume of the gaseous nitrogen source (1:1). Preferably the ratio of the gaseous titanium source to the gaseous nitrogen source will range from about 1:10 to about 1:2 in parts by volume.

The absolute amounts of the individual flow rates of the respective gaseous process gas sources, as well as the total gas flow, flowing through showerhead 34 into chamber 30 will depend upon the volume of the CVD chamber, with higher flow rates needed for larger chambers. For example, for a 35 liter CVD chamber, the flow rate of the respective gaseous reactants can be about 1000 standard cubic centimeters per minute (sccm) of gaseous TDEAT and about 13,000 sccm of ammonia. If desired, a carrier gas may also be optionally added to the reactant (process) gases to increase the total gas flow through the reactor.

The amount of deposition-inhibiting gas flowing into chamber 30 from gas source 64 through pipe 60, common bore 50 and individual angled bores 52, and bore ends 54 will also vary with the size of chamber 30, the size of substrate 2, and the volume of the process gases being flowed into chamber 30 through showerhead 34. As referred to above, the amount of deposition-inhibiting gas flowing into chamber 30 from bore ends 54 adjacent end edge 6 of substrate 2 will be that amount which will result in a deposit of titanium nitride on end edge 6 of substrate 2 which will not exceed the thickness of titanium nitride being deposited on top surface 4 of substrate 2. Preferably, the amount of titanium nitride deposited on end edge 6 of substrate 2, will range from about 100 Å to about 250 Å in thickness when the amount of titanium nitride deposited on top surface 4 of substrate 2 has an average thickness of about 300 Å.

Figure 3:
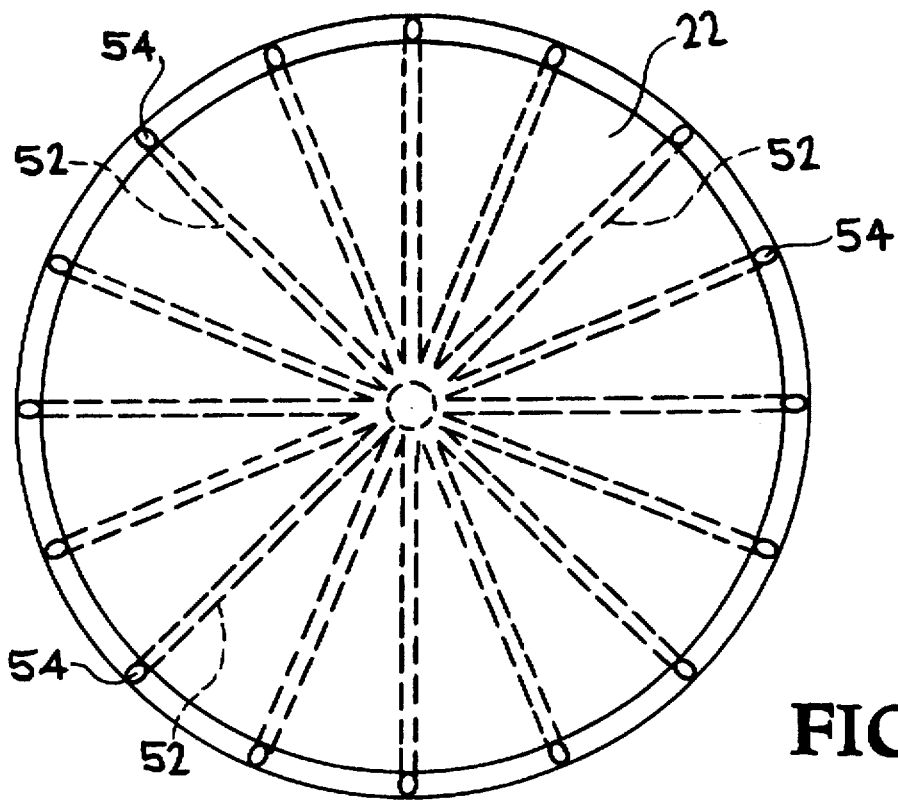
FIG. 3 is a top view of the substrate support pedestal of FIG. 2, taken along lines III—III to show the radial distribution of the bores provided in the substrate support pedestal to provide the upward flow of deposition-inhibiting gas around the end edge of the substrate.

Turning now to FIG. 3, the radial distribution of bores 52 and upper bore ends 54 in substrate support pedestal 40 is illustrated. In FIG. 3, sixteen bores 52 are shown with a radial distribution of 22.5° between each bore. Preferably the radial distribution is as little as 15°, i.e., twenty-four bores 52 are preferably radially distributed within substrate support 2, so that the flow of deposition-inhibiting gas over end edge 6 of substrate 2 from upper bore ends 54 is substantially uniform.

Figure 4:
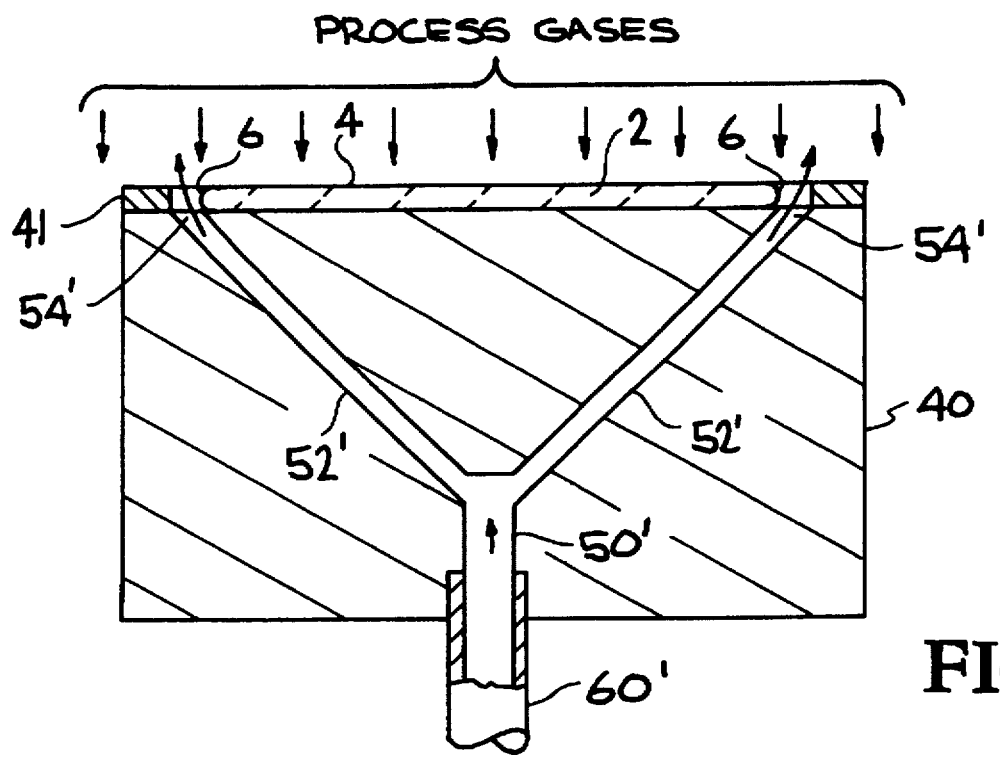
FIG. 4 is a fragmentary vertical side section view of another embodiment of the invention illustrating a semiconductor substrate mounted on a modified substrate support pedestal constructed, in accordance with the invention, to provide a flow of deposition-inhibiting gas adjacent the end edge of the substrate so that a layer of titanium nitride will be deposited on the substrate with a thinner portion deposited adjacent the end edge of the substrate.

FIG. 4 illustrates a modification of substrate support pedestal 40 in which a pedestal 40', having a diameter exceeding the diameter of substrate 2, is provided with a peripheral ring 41 mounted on its upper surface 44' and thereby surrounding end edge 6 of substrate 2. In this embodiment, deposition-inhibiting gas or gases flow into a central bore 50' from tube 60' and then flow through radially distributed bores 52' and out radially dispersed upper bore ends 54' to flow between end edge 6 of substrate 2 and the inner surface of ring 41 to thereby inhibit deposition of titanium nitride, formed by the process gases, from depositing on end edge 6 of substrate 2. It should be noted that in this embodiment, the flow of process gases to end edge 6 of substrate 2 is already partially inhibited by the presence of ring 41, particularly those portions of end edge 6 forming an angle of 45° or more with the plane of top surface 4 of substrate 2. Therefore, the flow of deposition-inhibiting gases will need to be downwardly adjusted to permit some deposition of titanium nitride on the 45°–90° portions of end edge 6, while still inhibiting excess deposition of titanium nitride on the 20°–45° portion of end edge 6.

Figure 6:
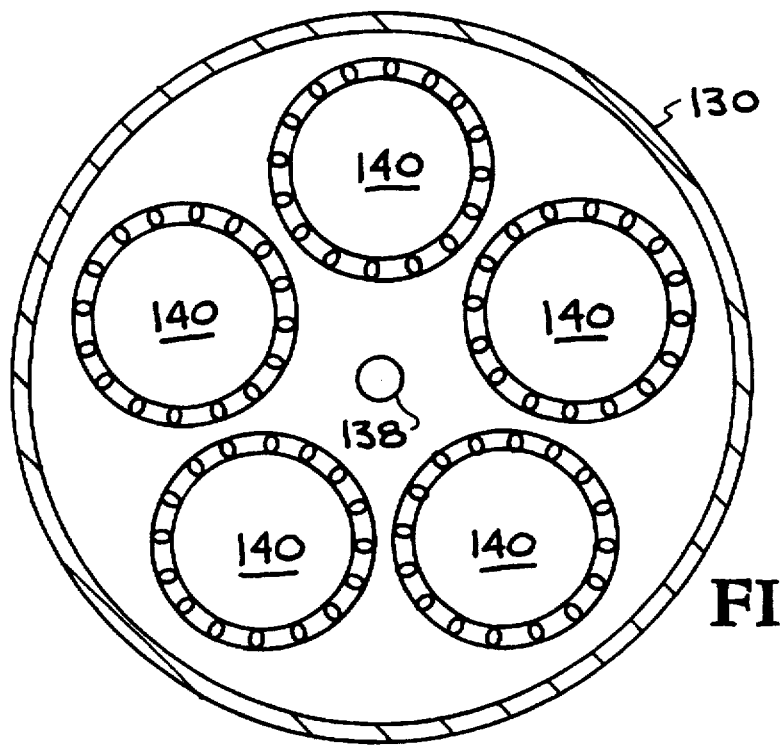
FIG. 6 is a top view of the deposition chamber of FIG. 5, taken along lines VI–VI to show the horizontal disposition of the multiple substrate support pedestals and to show the position of the central process gas exhaust port in the chamber relative to the pedestals.
Figure 5:
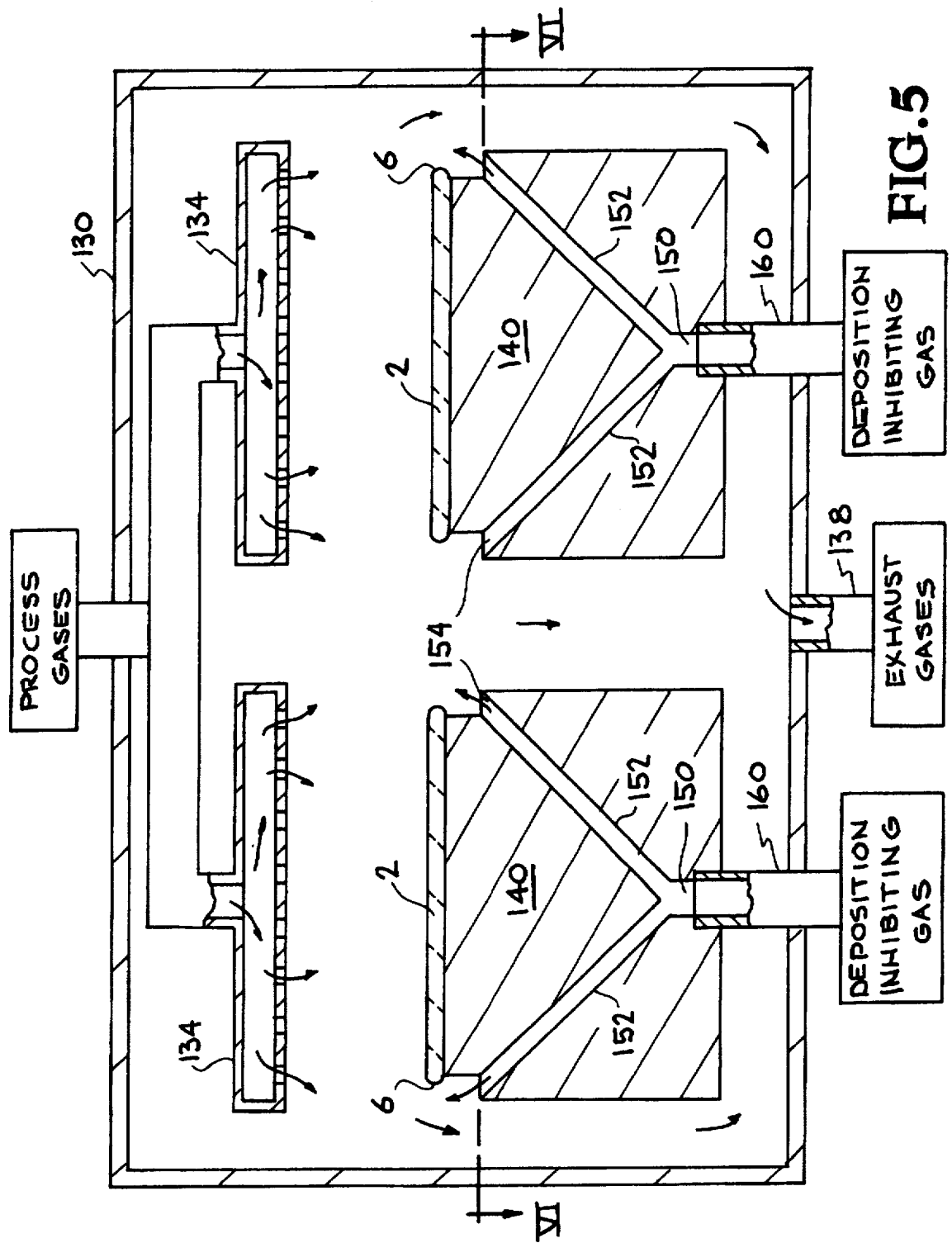
FIG. 5 is a fragmentary vertical side section view of a deposition chamber used for multiple substrate processing, showing semiconductor substrates respectively mounted in the chamber on a plurality of substrate support pedestals constructed in accordance with the invention.

FIGS. 5 and 6 illustrate the invention as applied to a deposition chamber used for processing multiple substrates at the same time. In this embodiment, a chamber 130 is provided with five substrate support pedestals 140, two of which are shown in the cross-sectional view of FIG. 5, and all of which are shown in the top view of FIG. 6. Deposition chamber 130 is further provided with five showerheads 134, one above each substrate support pedestal 140 through which process gases flow to deposit titanium nitride of the upper surfaces 4 (and end edges 6) of substrates 2 mounted on substrate support pedestals 140. A central exhaust port 138 is provided at the bottom of chamber 130 for exit of the process gases as they flow down from showerheads 134 over substrates 2.

In accordance with the invention, each substrate support pedestal 140 is provided with a central bore 150 through which deposition-inhibiting gases flow from a tube 160 to radially distributed angled bores 152 in each substrate support pedestal 140, emerging at upper bore ends 154 adjacent the end edge 6 of the respective substrate 2 to inhibit deposit of excessive amounts of titanium nitride on such end edge 6, as in the preceding embodiments.

Thus the invention provides a process and apparatus for reducing the amount of the deposition of titanium nitride on the end edge of a substrate in a MOCVD deposition process, without completely blocking or preventing such titanium nitride deposition on the end edge of the substrate so that the total thickness of titanium nitride deposited on the end edge of the substrate does not exceed, and preferably is less, than the thickness of the titanium nitride deposited on the top or upper surface of the substrate. Cracking and peeling of an excessively thick titanium nitride deposit on the end edge of the substrate is, thereby, prevent or eliminated.

Having thus described the invention what is claimed is:

1. In a process wherein titanium nitride is deposited on a substrate by chemical vapor deposition (CVD) using a flow of process gases comprising an organic source of titanium as the gaseous source of titanium, and a gaseous reactive source of nitrogen, the improvement which comprises controlling the amount of titanium nitride deposited on an end edge of said substrate, relative to the amount of titanium nitride deposited on an upper surface of said substrate, so that deposition of said titanium nitride on the end edge of said substrate is not eliminated and the amount of titanium nitride deposited on the end edge of said substrate does not exceed the amount of titanium nitride deposited on the upper surface of said substrate, by directing a flow of deposition-inhibiting gas toward said end edge of said substrate during said deposition, and controlling the amount of said flow of deposition-inhibiting gas directed toward said end edge of said substrate.

2. The process of claim 1 wherein said flow of deposition-inhibiting gas opposes said flow of process gases comprising said gaseous organic source of titanium and said gaseous reactive source of nitrogen.

3. The process of claim 1 wherein said flow of deposition-inhibiting gas is directed toward said end edge of said substrate by flowing said deposition-inhibiting gas through a plurality of bores radially dispersed in a substrate support pedestal below said substrate toward said end edge of said substrate.

4. The process of claim 3 wherein said flow of deposition-inhibiting gas in said substrate support pedestal toward said end edge of said substrate emerges from openings at upper ends of said bores in said substrate support pedestal radially dispersed around said pedestal adjacent said end edge of said substrate.

5. The process of claim 1 wherein said deposition-inhibiting gas is selected from the group consisting of non-reactive gases and a gas capable of reacting with one of said process gases to form said titanium nitride.

6. The process of claim 5 wherein said deposition-inhibiting gas comprises one or more Group VIII noble gases.

7. The process of claim 5 wherein said deposition-inhibiting gas comprises ammonia.

8. In a process wherein titanium nitride is deposited on a substrate by chemical vapor deposition (CVD) using a flow of process gases comprising an organic source of titanium as the gaseous source of titanium, and a gaseous reactive source of nitrogen, the improvement which comprises depositing from about 100 Å to about 250 Å of titanium nitride on an end edge of said substrate, while depositing titanium nitride on an upper surface of said substrate, by flowing a controlled amount of deposition-inhibiting gas through bores in a substrate support beneath said substrate to emerge through bore ends in said substrate support peripherally spaced around said substrate support adjacent said end edge of said substrate, whereby a controlled amount of said deposition-inhibiting gas then flows over said end edge of said substrate during said titanium nitride deposition in a direction opposing said flow of process gases to thereby control the amount of titanium nitride deposited on said end edge of said substrate.

9. In a process wherein titanium nitride is deposited on a substrate by chemical vapor deposition (CVD) using a flow of process gases comprising an organic source of titanium as the gaseous source of titanium, and a gaseous reactive source of nitrogen, the improvement which comprises depositing from about 100 Å to about 250 Å of titanium nitride on an end edge of said substrate, while depositing titanium nitride on an upper surface of said substrate, by flowing a controlled amount of deposition-inhibiting gas through angled bores in a substrate support beneath said substrate and directed toward said end edge of said substrate to emerge through bore ends of said angled bores in said substrate support which are peripherally spaced around said substrate support at said end edge of said substrate, whereby a controlled amount of said deposition-inhibiting gas is then directed to flow toward and over said end edge of said substrate during said titanium nitride deposition in a direction which opposes said flow of process gases toward said end edge to thereby control the amount of titanium nitride deposited on said end edge of said substrate.

\* \* \* \* \*